Sept. 10, 1968 A. A. SCOTT ET AL 3,401,315

COMPRESSION ASSEMBLED SEMICONDUCTOR DEVICE USING SPHERICAL FORCE TRANSMITTING MEMBER

Filed Oct. 31, 1966

INVENTORS
ANGUS A. SCOTT
RICHARD A. HARTMAN
BY
OSTROLENK, FABER, GERB & SOFFEN
ATTORNEYS

United States Patent Office 3,401,315
Patented Sept. 10, 1968

3,401,315
COMPRESSION ASSEMBLED SEMICONDUCTOR DEVICE USING SPHERICAL FORCE TRANSMITTING MEMBER

Angus A. Scott and Richard A. Hartman, Palos Verdes Estates, Calif., assignors to International Rectifier Corporation, El Segundo, Calif., a corporation of California Filed Oct. 31, 1966, Ser. No. 590,758
7 Claims. (Cl. 317—234)

ABSTRACT OF THE DISCLOSURE

A semiconductor device assembly is provided in which the semiconductor wafer means is held in firm electrical and mechanical contact with at least one terminal by means of a novel force applying structure. This force applying structure includes a spring which could be formed of spring washers which are mechanically connected in series by an interposed rigid member having at least partially spherical surfaces. This will permit the wafer structure to automatically align itself with respect to the surface against which it seats without applying bending stresses to the wafer. As an additional feature in the disclosure the partially spherical member is of conductive material and is provided with a by-pass shunt to permit flow of current around the high resistance spherical member and springs.

This invention relates to semiconductor devices, and more particularly relates to a novel semiconductor assembly using compression bonding techniques for connecting the wafer means to the major terminals of the device.

Compression bonding arrangements are well known to the art wherein a wafer subassembly is connected to the major terminals of the device by compressional forces rather than by soldering or the like. Such compression bonding can be applied to pressure connect a semiconductor wafer, which may have one or more junctions therein, to expansion plates on the upper and lower surfaces of the wafer, and simultaneously to pressure connect the expansion plates to the major terminals of the device. The expansion plates may alternatively be initially soldered to the wafer by any suitable hard solder with only the expansion plates pressure connected to main terminal members. The expansion plates may be of any material whose thermal characteristics are matched to the thermal characteristics of the relatively brittle wafer. Thus, where silicon is selected as the semiconductor material for the wafer, good results have been obtained using molybdenum or tungsten expansion plates. The entire assembly is then compression bonded with at least one of the expansion plates abutting directly atop a massive terminal which could, for example, be of copper or aluminum, with the abutting surfaces held in engagement by the compressional forces of a suitable spring.

In accordance with the present invention, the spring structure is formed of suitable spring means, such as conical spring washers, which are placed on opposite sides of an at least partially spherical member. Thus, the spring forces are transmitted through the at least partially spherical surfaces of the force transmitting member so that, in the event of nonparallelism between the opposing surfaces of the wafer or its expansion plate and the terminal to which it is to be joined, the entire assemblage will slightly bend at the connection between the sphere and the spring to absorb such nonparallelism without imparting any bending stresses to the wafer. As another feature of the invention, a conductive shunt is connected across the ball and spring arrangement to substantially eliminate current flow through the ball and its connection to the spring, thereby to eliminate a point of high resistance in the electrical series connection through the main terminals and wafer which would otherwise include the ball and springs.

Accordingly, a primary object of this invention is to provide a novel construction for semiconductor devices which is simple to manufacture.

Yet another object of this invention is to provide a novel means for applying compressional forces between a semiconductor wafer means and a relatively massive terminal thereof.

Yet another object of this invention is to provide a novel compression bonded assembly for semiconductor devices which includes means therein for permitting the automatic adjustment of the plane of a wafer means without imparting bending forces to the wafer.

These and other objects of this invention will become apparent from the following description when taken in connection with the drawings, in which.

Figure 1:
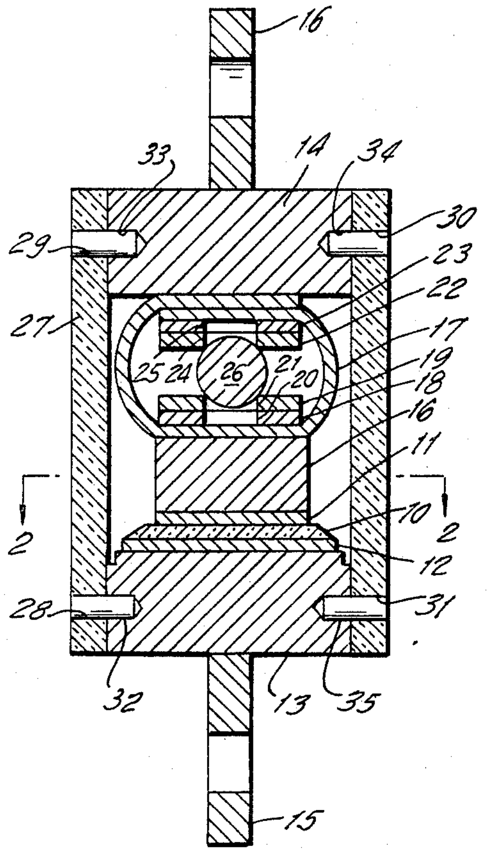
FIGURE 1 is a side cross-sectional view of a semiconductor device assembly constructed in accordance with the present invention.
Figure 3:
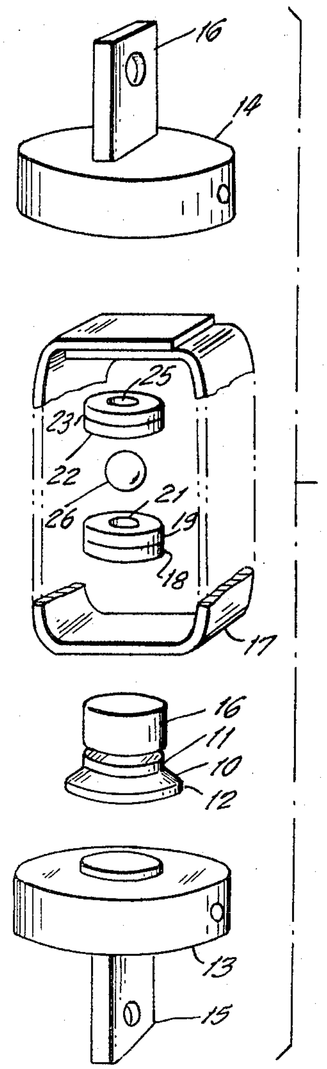
FIGURE 3 is an exploded perspective view of the structure interior of the outer housing of FIGURE 1.
Figure 2:
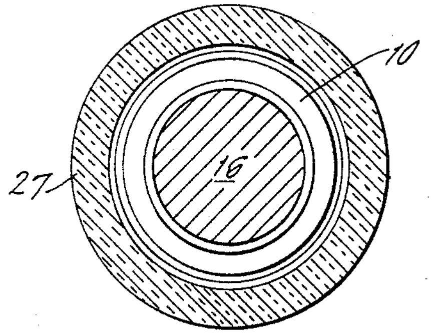
FIGURE 2 is a cross-sectional view of FIGURE 1 taken across the line 2—2 in FIGURE 1.

Referring now to the drawings, there is illustrated a semiconductor device subassembly which is formed of a semiconductor wafer 10 which could be of silicon and could have one or more junctions therein. The edges of the junction may be beveled as shown to improve the reverse voltage characteristics of the device. Upper and lower expansion plates 11 and 12 respectively, which could be of molybdenum, are then disposed on opposite sides of wafer 10. The expansion plates 11 and 12 could be soldered to the opposing surfaces of wafer 10 by some suitable hard solder.

The wafer subassembly of members 10, 11 and 12 is then connected electrically in series between relatively massive conductive terminals 13 and 14 which may be of copper and which could have projecting connection terminals 15 and 16 respectively. The bottom surface of expansion plate 12 is then in surface-to-surface contact with the upper surface of terminal 13 with the electrical and thermal connection between these surfaces being accomplished by pressure from the spring biasing means to be described hereinafter.

A conductive terminal insert 16 then abuts the upper surface of expansion plate 11, again in pressure contact in a manner similar to the pressure connection between expansion plate 12 and terminal 13. The upper surface of insert 16, which may be of copper, is then suitably brazed or soldered to a conductive strap 17 which is also suitably brazed or soldered to the bottom of terminal 14. While the strap 17 is shown in FIGURE 1 as having overlapping ends, it will become apparent that the strap could have a U-shape and need not be enclosed as illustrated.

Two spring washers 18 and 19 are then positioned atop the lower portion of strap 17 and have circular openings, such as openings 20 and 21 therein while a similar washer arrangement, composed of washers 22 and 23, having openings 24 and 25 therein are positioned below the top of the conductive strap 17. A steel ball 26 is then partially captured in the adjacent openings 21 and 24 of spring washers 19 and 22 as illustrated.

The device assembly is then held fixed by means of a suitable insulation tube 27 which may have openings 28, 29, 30 and 31 therein which are aligned with similar openings 32, 33, 34 and 35 respectively in terminals 13 and 14. Suitable screws or bolts (not shown) may then be inserted in these aligned openings in order to hold the assemblage fixed and to cause the compression of the various springs 18, 19, 22 and 23 against ball 26 in order to apply the desired compressional forces between conductive members 13 and 16 and the wafer subassembly composed of members 10, 11 and 12.

The conductive strap 17 serves as a shunt for the springs 28, 29, 22 and 23 and the ball 26 so that a direct series electrical connection can be taken from terminal 13 through members 10, 11 and 12, to conductor 16, the conductive strap 17 and finally to terminal 14. Compressional forces, however, are exerted through the ball 26 whereupon any nonparallelism between the opposing surfaces of expansion plate 11 and member 16 or expansion plate 12 and member 13 will be absorbed by an automatic alignment of springs 18, 19, 22 and 23 around the ball 26. Note that strap 17 will be suitably flexible to permit such minor realignments as may be necessary to insure parallelism between the various surfaces which are to be compression bonded to one another.

Although this invention has been described with respect to its preferred embodiments, it should be understood that many variations and modifications will now be obvious to those skilled in the art, and it is, preferred, therefore, that the scope of the invention be limited not by the specific disclosure herein, but only by the appended claims.

The embodiments of the invention in which an exclusive privilege or property is claimed are defined as follows:

1. A semiconductor device assembly comprising a semiconductor wafer means, a pair of conductive terminal members positioned on opposite sides of said semiconductor wafer means, a compression assembly interposed between one of said pair of terminals and said semiconductor wafer means for forcing one surface of said wafer into high pressure contact with the opposing surface of the other of said pair of terminal members, and housing means securing said pair of terminal members with respect to one another; said compression assembly including first and second compression spring means and a force transmitting member interposed between said compression spring means; said force transmitting means having an at least partially arcuate surface engaging said compression spring means.

2. The device as set forth in claim 1 wherein said force transmitting means comprises a spherical body.

3. The device as set forth in claim 1 wherein said compression spring means and said second compression spring means are spring washers.

4. The device as set forth in claim 3 wherein said spring washers have central openings; said force transmitting means having at least partially arcuate surfaces partially disposed in said openings.

5. The device as set forth in claim 1 which includes a conductive strap electrically connected across said compression assembly.

6. The device as set forth in claim 4 which includes a conductive strap electrically connected across said compression assembly.

7. The device as set forth in claim 6 wherein said conductive strap is bent to at least a U-shape; said compression assembly contained within the legs of said at least U-shaped strap.

References Cited

UNITED STATES PATENTS

| | | | |
|---|---|---|---|
| 1,908,800 | 5/1933 | Utne | 317—234 |
| 2,888,618 | 5/1959 | Lockett | 317—234 |

FOREIGN PATENTS

| | | |
|---|---|---|
| 289,633 | 6/1965 | Netherlands. |

JOHN W. HUCKERT, *Primary Examiner.*

J. D. CRAIG, *Assistant Examiner.*